United States Patent
Ito

(10) Patent No.: US 11,368,135 B2
(45) Date of Patent: Jun. 21, 2022

(54) HIGH-FREQUENCY MODULE

(71) Applicant: Murata Manufacturing Co., Ltd., Kyoto (JP)

(72) Inventor: Takanori Ito, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 78 days.

(21) Appl. No.: 16/812,504

(22) Filed: Mar. 9, 2020

(65) Prior Publication Data

US 2020/0212870 A1 Jul. 2, 2020

Related U.S. Application Data

(63) Continuation of application No. PCT/JP2018/025986, filed on Jul. 10, 2018.

(30) Foreign Application Priority Data

Sep. 12, 2017 (JP) .............................. JP2017-175156

(51) Int. Cl.
*H03H 7/38* (2006.01)
*H03H 7/46* (2006.01)
(Continued)

(52) U.S. Cl.
CPC ................ *H03H 7/38* (2013.01); *H03H 7/46* (2013.01); *H03H 9/25* (2013.01); *H03H 9/52* (2013.01); *H03H 9/64* (2013.01); *H03H 9/725* (2013.01)

(58) Field of Classification Search
CPC .. H03H 7/38; H03H 7/46; H03H 9/25; H03H 9/52; H03H 9/64; H03H 9/725
See application file for complete search history.

(56) References Cited

U.S. PATENT DOCUMENTS

2010/0127799 A1 5/2010 Bauer et al.
2014/0118084 A1 5/2014 Takemura
(Continued)

FOREIGN PATENT DOCUMENTS

JP 2009500928 A 1/2009
WO 2013008435 A1 1/2013
(Continued)

OTHER PUBLICATIONS

International Search Report for International Application No. PCT/JP2018/025986, dated Aug. 14, 2018.
(Continued)

*Primary Examiner* — Samuel S Outten
(74) *Attorney, Agent, or Firm* — Pearne & Gordon LLP

(57) ABSTRACT

A high-frequency module (10) includes a laminated substrate formed by laminating a plurality of insulator layers, a first terminal (P1) and a second terminal (P2) provided on the laminated substrate, a filter (20) connected between the first terminal (P1) and the second terminal (P2), a matching circuit (40) connected between the first terminal (P1) and the filter (20), and an inductor (60) provided as a conductor pattern in or on the laminated substrate, and connected between the filter (20) and the ground. The matching circuit (40) includes a mounting circuit unit (41) provided as an individual component on the laminated substrate, and a layer circuit (42) provided as a conductor pattern in or on the laminated substrate. A layer circuit unit (42) is electromagnetically coupled to the inductor (60).

21 Claims, 4 Drawing Sheets

(51) Int. Cl.
*H03H 9/25* (2006.01)
*H03H 9/52* (2006.01)
*H03H 9/64* (2006.01)
*H03H 9/72* (2006.01)

(56) References Cited

U.S. PATENT DOCUMENTS

| | | |
|---|---|---|
| 2016/0028364 A1 | 1/2016 | Takechi |
| 2016/0156328 A1 | 6/2016 | Takeuchi et al. |
| 2017/0077896 A1 | 3/2017 | Sugaya et al. |
| 2017/0111078 A1* | 4/2017 | Onodera ............... H03H 9/725 |
| 2018/0287582 A1 | 10/2018 | Matsumoto et al. |

FOREIGN PATENT DOCUMENTS

| | | |
|---|---|---|
| WO | 2014168162 A1 | 10/2014 |
| WO | 2015019980 A1 | 2/2015 |
| WO | 2016136413 A1 | 9/2016 |
| WO | 2017110639 A1 | 6/2017 |

OTHER PUBLICATIONS

Written Opinion for International Application No. PCT/JP2018/025986, dated Aug. 14, 2018.

\* cited by examiner

HIGH-FREQUENCY MODULE

This is a continuation of International Application No. PCT/JP2018/025986 filed on Jul. 10, 2018 which claims priority from Japanese Patent Application No. 2017-175156 filed on Sep. 12, 2017. The contents of these applications are incorporated herein by reference in their entireties.

BACKGROUND OF THE DISCLOSURE

Field of the Disclosure

The present disclosure relates to a high-frequency module including a laminated substrate on which a filter is mounted.

Description of the Related Art

Patent Document 1 describes a high-frequency module including a filter unit connected between a first external connection terminal and a second external connection terminal, a matching circuit connected between the first external connection terminal and the filter unit, and an inductor connected between the filter unit and the ground. The matching circuit is mounted on a laminated substrate as a mounting circuit element, and the inductor is formed in an inner layer of the laminated substrate. Attenuation characteristics of the filter unit are improved by using a coupling circuit obtained by inductively coupling or capacitively coupling the matching circuit and the inductor to each other.

Patent Document 1: International Publication No. 2015/019980

BRIEF SUMMARY OF THE DISCLOSURE

As described above, in the configuration described in Patent Document 1, the mounting circuit element is used as the matching circuit. This is because when the mounting circuit element is used, for example, an inductance value as that of the matching element can be increased, and an insertion loss can be reduced. However, when the mounting circuit element and the inductor formed in the inner layer of the laminated substrate are coupled to each other in order to improve the attenuation characteristics of the filter, there is a problem that a sufficient amount of coupling cannot be obtained.

Thus, the present disclosure is made to solve the above problem, and an object of the present disclosure is to provide a high-frequency module that is capable of suppressing the deterioration in the insertion loss in a matching circuit, and in which a coupling circuit for improving the attenuation characteristics is easily obtained.

In order to achieve the above object, a high-frequency module according to an aspect of the present disclosure includes a laminated substrate formed by laminating a plurality of insulator layers, a first terminal and a second terminal provided on the laminated substrate, a filter connected between the first terminal and the second terminal, a matching circuit connected between the first terminal and the filter, and an inductor provided as a conductor pattern in or on the laminated substrate, and connected between the filter and a ground. The matching circuit includes a mounting circuit unit provided as an individual component on the laminated substrate, and a layer circuit provided as a conductor pattern in or on the laminated substrate. A layer circuit unit is electromagnetically coupled to the inductor.

A high-frequency module according to another aspect of the present disclosure includes a first terminal, a second terminal, a filter connected between the first terminal and the second terminal, a matching circuit connected between the first terminal and the filter, an inductor connected to the filter and a ground, and a laminated substrate provided with the filter, the matching circuit, and the inductor. The filter is mounted on the laminated substrate. The matching circuit includes a mounting circuit unit mounted on the laminated substrate, and a layer circuit unit formed in at least one of an inner layer and an outer layer of the laminated substrate. The inductor is formed in at least one of the inner layer and the outer layer of the laminated substrate. A layer circuit unit is electromagnetically coupled to the inductor.

According to the configuration, in a case where a large element value is required for the matching circuit, when an element value of the mounting circuit unit is increased, an insertion loss is less likely to be increased. In addition, when the matching circuit and the inductor cannot electromagnetically couple with each other, or when electromagnetic field coupling is possible but a coupling coefficient thereof is not sufficiently obtained, by using the layer circuit unit for the electromagnetic field coupling, the coupling coefficient can be increased to such an extent that a coupling circuit is formed. Thus, the deterioration in the insertion loss can be suppressed, and it becomes easy to obtain a coupling circuit as well. Note that, in the present specification or the like, "being provided as an individual component on the laminated substrate" refers to being mounted as an individual chip component on the laminated substrate, not being patterned as a conductor pattern on the laminated substrate. On the other hand, in the present specification or the like, "being provided as a conductor pattern in or on the laminated substrate" refers to being patterned as a conductor pattern in or on the laminated substrate, not being mounted as an individual chip component on the laminated substrate.

Further, a distance between the layer circuit unit and the inductor is preferably shorter than a distance between the mounting circuit unit and the inductor.

That is, a coupling coefficient between the layer circuit unit and the inductor is preferably higher than a coupling coefficient between the mounting circuit unit and the inductor.

According to the configuration, a coupling circuit becomes more likely to be formed between the layer circuit unit and the inductor, than between the mounting circuit unit and the inductor. Thus, even when the coupling between the mounting circuit unit and the inductor becomes weak due to a large increase in distance between the mounting circuit unit and the inductor, or the like, a coupling circuit becomes less likely to disappear by the layer circuit unit and the inductor. That is, a coupling circuit can be more easily formed.

Further, at least one another inductor different from the inductor and connected between the filter and the ground is further included, the first terminal is preferably an output terminal from which a high-frequency signal is outputted, the second terminal is preferably an input terminal to which a high-frequency signal is inputted, and the inductor is preferably an inductor closest to the second terminal among a plurality of inductors including the inductor and the at least one other inductor.

In the high-frequency module according to the present disclosure, a high-frequency signal propagating through the coupling circuit is canceled out by being combined with a high-frequency signal propagating through the filter, thereby improving the attenuation characteristics.

According to the configuration, the strength of the high-frequency signal propagating through the coupling circuit increases, compared to a case where an inductor that is second closest or third closest to the second terminal is coupled to the matching circuit. Thus, it becomes easy to cancel out the high-frequency signal propagating through the filter, and the attenuation characteristics can be more reliably enhanced.

In this case, the filter may be a transmission filter filtering a transmission signal.

In addition, at least a part of the layer circuit unit and the inductor preferably overlap with each other, when viewed in plan view.

According to the configuration, compared to a case where the layer circuit unit and the inductor do not overlap with each other at all in plan view, the layer circuit unit and the inductor are more likely to strongly couple with each other. Thus, the matching circuit and the inductor can be electromagnetically coupled to each other efficiently.

Further, the layer circuit unit and the inductor are preferably connected to the ground by a common via conductor.

According to the configuration, the structure of the present disclosure can be realized in a smaller space, compared to a case where the layer circuit unit and the inductor are connected to the ground by the respective separate via conductors. Thus, it is possible to reduce the high-frequency module in size.

Further, the high-frequency module may include a third terminal, and the filter may include a first filter unit connected between the first terminal and the second terminal, and a second filter unit connected between the first terminal and the third terminal.

According to the configuration, it is possible to obtain a high-frequency module for which the isolation characteristics between the second terminal and the third terminal are excellent.

According to the high-frequency module according to the present disclosure, an insertion loss in the matching circuit included in the high-frequency module is reduced, and it becomes easier to obtain a coupling circuit between the matching circuit and the inductor.

BRIEF DESCRIPTION OF THE SEVERAL VIEWS OF THE DRAWINGS

FIG. 4A is a diagram illustrating elements mounted on a laminated substrate, and inductors connected to these elements, and FIG. 4B is a diagram obtained by extracting the inductors and surroundings thereof from FIG. 4A.

DETAILED DESCRIPTION OF THE DISCLOSURE

Hereinafter, a high-frequency module according to an embodiment of the present disclosure will be described in detail with reference to the accompanying drawings. Note that, the embodiment described below illustrates comprehensive or specific examples. Materials, shapes, constituent elements, arrangement and connection form of the constituent elements, and the like illustrated in the following embodiment are merely examples, and are not intended to limit the present disclosure. Among the constituent elements in the following embodiment, constituent elements that are not described in the independent claims will be described as arbitrary constituent elements.

[1. Circuit Configuration]

Figure 1:
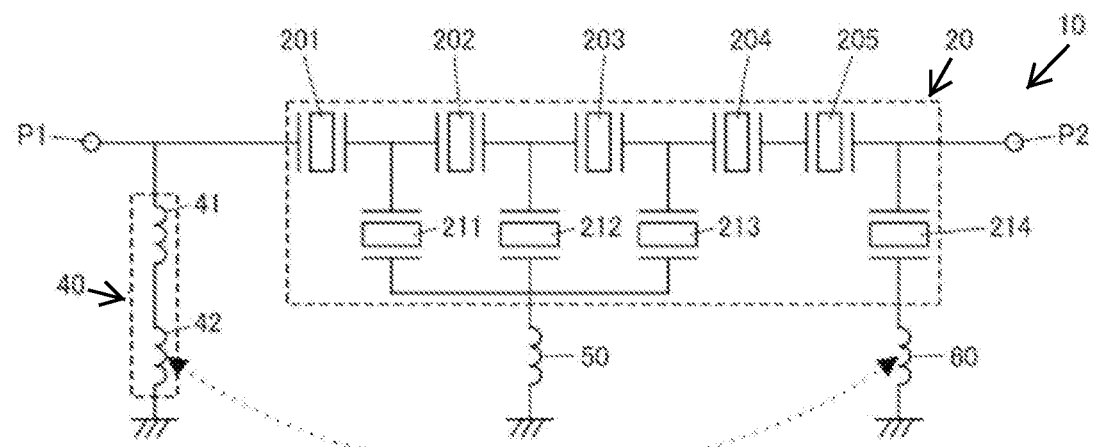
FIG. 1 is a circuit diagram illustrating a circuit design of a high-frequency module according to an embodiment.

FIG. 1 is a circuit diagram illustrating a circuit configuration of the high-frequency module according to the embodiment of the present disclosure. As illustrated in the figure, a high-frequency module 10 includes terminals P1 and P2, a filter 20, a matching circuit 40, and inductors 50 and 60. The high-frequency module 10 is connected to an antenna element (not illustrated) or the like via the terminal P1.

The filter 20 is a filter for filtering a high-frequency signal inputted from the terminal P2 in a predetermined band. At this time, the high-frequency signal is inputted to the filter 20 via the terminal P2 that is an input terminal, and is outputted to the terminal P1 that is an output terminal.

The filter 20 is connected between the terminal P1 and the terminal P2. The filter 20 is provided with series arm resonators 201 to 205 and parallel arm resonators 211 to 214. Each of the series arm resonators 201 to 205 is provided on a path connecting the terminal P1 and the terminal P2. Each of the parallel arm resonators 211 to 214 is provided on a path connecting a node on the path connecting the terminal P1 and the terminal P2 and the ground. The parallel arm resonators 211 to 213 are connected to the ground via the inductor 50. In addition, the parallel arm resonator 214 is connected to the ground via the inductor 60.

The matching circuit 40 is provided on a path connecting a node on a path connecting the terminal P1 and the filter 20 and the ground. An element value (inductance) of the matching circuit 40 is set to an element value for realizing the impedance matching between the antenna element or the like connected to the terminal P1 and the filter 20. The matching circuit 40 is configured with an inductor 41 and an inductor 42 that are connected in series with each other.

At this time, by using electromagnetic field coupling as indicated by a broken line arrow between the inductor 42 and the inductor 60, the matching circuit 40 electromagnetically couples with the inductor 60. That is, the matching circuit 40 inductively couples with the inductor 60, or capacitively couples with at least a part of each conductor that constitutes the inductor 60.

With the configuration described above, a circuit is formed between the matching circuit 40 and the inductor 60. For example, when the matching circuit 40 and the inductor 60 inductively couple with each other, an inductive coupling circuit having mutual inductance is formed between the matching circuit 40 and the inductor 60, so that a high-frequency signal propagates through the inductive coupling circuit. Accordingly, a high-frequency signal propagating between the terminal P1 and the terminal P2 propagates through, in addition to a main propagation path passing through the terminal P2, the filter 20, and the terminal P1, a sub propagation path passing through the terminal P2, the inductor 60, the inductive coupling circuit indicated by a dotted line arrow, the matching circuit 40, and the terminal P1.

Thus, a high-frequency signal that is propagated between the terminal P1 and the terminal P2, and is outputted is a high-frequency signal formed by combining a high-frequency signal propagating through the main propagation path and a high-frequency signal propagating through the sub propagation path.

In this case, depending on a relationship between amplitude and a phase of the high-frequency signal propagating through the main propagation path, and amplitude and a phase of the high-frequency signal propagating through the sub propagation path, the high-frequency signals propagating through the respective propagation paths cancel each other out and are attenuated, when combined. Thus, depending on how the amplitude and phase of the high-frequency signal propagating through each of the propagation paths are adjusted, the attenuation characteristics outside a frequency band that is a pass band of the filter 20 located between the terminal P1 and the terminal P2 can also be adjusted.

Here, by adjusting the amplitude and phase of the high-frequency signal propagating through the sub propagation path, instead of the main propagation path passing through the filter 20, the above attenuation characteristics can be adjusted with hardly affecting amplitude and a phase of a high-frequency signal in the pass band of the filter 20.

The amplitude and phase of the high-frequency signal propagating through the sub propagation path can be adjusted by a coupling coefficient between the coupled matching circuit 40 and inductor 60 and a direction of the coupling. Accordingly, when the matching circuit 40 and the inductor 60 are electromagnetically coupled to each other, adjusting the coupling coefficient and the direction makes it possible to obtain the high-frequency module 10 including the filter 20 having excellent attenuation characteristics outside the pass band.

Further, at this time, it is the inductor 60 closest to the terminal P2 being an input terminal, out of the inductors 50 and 60, that the matching circuit 40 electromagnetically couples with. Note that, in the present specification, "closest" refers to "closest in terms of electric circuit".

A high-frequency signal propagating between two terminals connected via a filter is attenuated while passing through an inside of the filter. Specifically, in the present embodiment, the high-frequency signal inputted from the terminal P2 is attenuated, every time passing through each of the series arm resonators 201 to 205 and the parallel arm resonators 211 to 214 provided in the filter 20, and is outputted to the terminal P1.

For example, a high-frequency signal is attenuated largely when passing through the parallel arm resonator 213, compared to when passing through the parallel arm resonator 214. That is, the high-frequency signal propagating from the parallel arm resonator 213 to the inductor becomes weaker than a high-frequency signal propagating from the parallel arm resonator 214 to the inductor.

When the inductor 60 closest to the terminal P2 is electromagnetically coupled to the matching circuit 40, the strength of a high-frequency signal propagating through the sub propagation path is enhanced, compared to when the inductor 50 is electromagnetically coupled to the matching circuit 40. Accordingly, it becomes possible to cancel out a high-frequency signal propagating through the main propagation path more reliably, and to improve the attenuation characteristics more reliably.

Note that, the terminal P1 may be an input terminal, and the terminal P2 may be an output terminal. In this case, it is preferable to provide the matching circuit 40 between the terminal P2 as the output terminal and the filter 20, and to electromagnetically couple the matching circuit 40 to the inductor closest to the terminal P1.

Additionally, although not illustrated in the figure, the matching circuit 40 may be provided in series on the path connecting the terminal P1 and the filter 20.

In addition, for the matching circuit 40, capacitors connected in series may be used instead of the inductors. In this case, by capacitively coupling the capacitor of the matching circuit 40 and a part of a linear conductor constituting the inductor 60 to each other, the configuration of the present disclosure can be realized.

The high-frequency module 10 having the circuit configuration described above is realized by using the following structure in the present embodiment. The present disclosure solves the problem and makes it possible, by configuring the matching circuit 40 with the inductors 41 and 42 having different configurations from each other as illustrated below, to suppress the deterioration in the insertion loss, and to easily obtain a coupling circuit for improving the attenuation characteristics.

[2. Structure]

Figure 2:
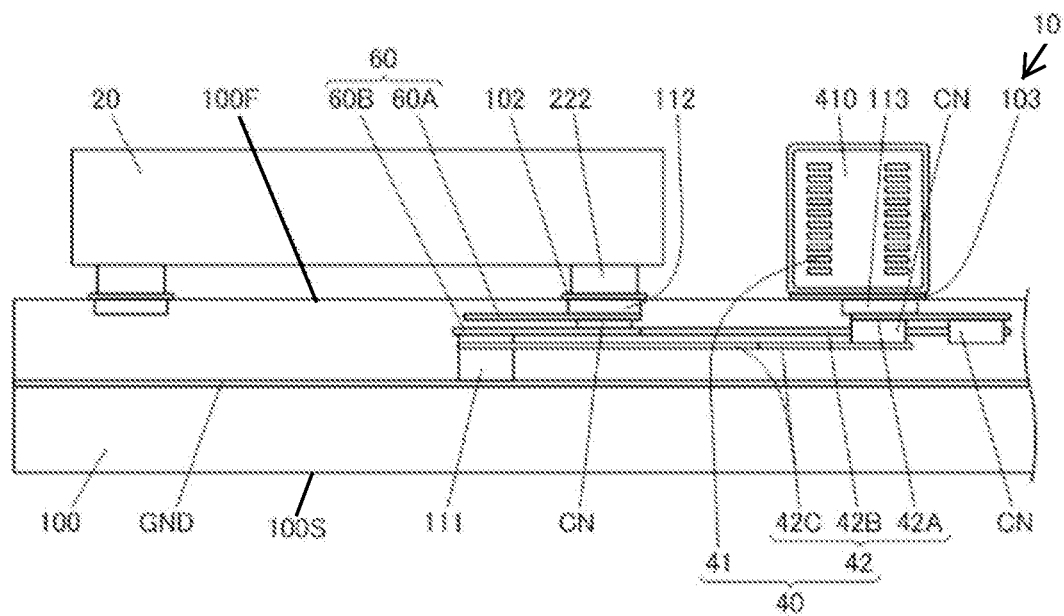
FIG. 2 is a schematic side view illustrating the main structure of the high-frequency module according to the embodiment.

FIG. 2 is a schematic side view illustrating the main structure of the high-frequency module 10. The high-frequency module 10 includes a laminated substrate 100, the filter 20, and a mounting circuit element 410.

The laminated substrate 100 is formed by laminating a plurality of dielectric layers. Predetermined conductor patterns are formed on a first main surface 100F and in an inner layer of the laminated substrate 100. The conductor patterns form wiring conductors, including an electrode pad 102 on which the filter 20 is mounted, an electrode pad 103 on which the mounting circuit element 410 is mounted, and via conductors 111 to 113, and the inductors 42 and 60, and the like.

The inductors 42 and 60 are configured with linear conductors 42A to 42C and 60A and 60B, and interlayer connection conductors CN. The linear conductor 42A forming one end of the inductor 42 is connected to the electrode pad 103 with the via conductor 113 interposed therebetween, and the linear conductor 42C forming another end is connected to a ground pattern GND formed in the inner layer of the laminated substrate 100 with the via conductor 111 interposed therebetween. The linear conductor 60A forming one end of the inductor 60 is connected to the electrode pad 102 with the via conductor 112 interposed therebetween, and the linear conductor 60B forming another end is connected to the ground pattern GND formed in the inner layer of the laminated substrate 100 with the via conductor 111 interposed therebetween.

Further, a plurality of electrodes for external connection (not illustrated) is formed on a second main surface 100S of the laminated substrate 100. The terminals P1 and P2 are configured with these electrodes for external connection.

The filter 20 is made of, for example, an acoustic wave element having wafer level package (WLP) structure including a piezoelectric substrate on which an interdigital transducer (IDT) electrode is provided. The IDT electrode forms each of the series arm resonators 201 to 205 and the parallel arm resonators 211 to 214.

The filter 20 having the above structure is mounted on the first main surface 100F of the laminated substrate 100, with a bump 222 and the electrode pad 102 interposed therebetween. Accordingly, the filter 20 is electrically connected to the terminals P1 and P2.

The mounting circuit element 410 is an element configuring the inductor 41. The mounting circuit element 410 is provided with a rectangular parallelepiped housing made of an insulating material, and a spiral electrode serving as the inductor 41 is provided inside the housing. The spiral electrode extends along an outer periphery of the housing, and is formed of linear conductors and interlayer connection conductors. The linear conductors of respective layers are connected so as to be a single line conductor by the interlayer connection conductors. Both ends of the spiral electrode are connected to respective external connection electrodes that are formed on respective opposite end surfaces of the housing.

The mounting circuit element 410 is mounted on the first main surface 100F of the laminated substrate 100 with the electrode pad 103 interposed therebetween. That is, the mounting circuit element 410 is connected to the inductor 42 via the electrode pad 103 and the via conductor 113.

(1. Main Structure)

Main features of the present embodiment are that the matching circuit 40 is configured with the two inductors, that is, the inductor 41 configured by the mounting circuit element 410 and the inductor 42 located in the inner layer of the laminated substrate 100, and that the inductor 42 electromagnetically couples with the inductor 60.

In the high-frequency module having the above feature, it becomes possible to suppress the deterioration in the insertion loss, and to make it easy to obtain a coupling circuit.

On the other hand, a significant problem does not occur even when the inductor that is electromagnetically coupled to the matching circuit is provided at the inner and outer layers of the laminated substrate. This is because the inductor is provided to correct the characteristics of the filter, and can function with a comparatively small inductor value. That is, since it is unnecessary to significantly extend a conductor configuring the inductor, it is possible to provide the inductor at the inner and outer layers of the laminated substrate without significant the deterioration in the insertion loss.

When an attempt is made to electromagnetically couple the matching circuit provided as the mounting circuit element in this manner and the inductor provided at the inner and outer layers of the laminated substrate to each other as described above, the coupling between the matching circuit and the inductor may not be obtained sufficiently. For example, when a distance between the matching circuit and the inductor is increased, respective magnetic fluxes generated in the matching circuit and the inductor become unlikely to couple with each other, so that a coupling coefficient between both the sides is likely to lower. In this case, it becomes difficult to obtain a coupling coefficient sufficient to form the above coupling circuit.

On the other hand, the high-frequency module according to the present disclosure solves the above problem, by providing the matching circuit in each of the mounting circuit unit mounted on the laminated substrate, and the layer circuit unit formed at the inner and outer layers of the laminated substrate, and by electromagnetically coupling the matching circuit in the layer circuit unit and the inductor to each other.

Specifically, the inductor 41 out of the inductors 41 and 42 configuring the matching circuit 40 is mounted on the laminated substrate 100 as the "mounting circuit unit" in the present disclosure, and the inductor 42 is provided in the inner layer of the laminated substrate 100 as the "layer circuit unit" in the present disclosure. Here, when a comparatively large element value is required for the matching circuit 40, by increasing an inductor value of the inductor 41 out of the inductors 41 and 42 to realize the required element value, the deterioration in the insertion loss is less likely to occur.

Further, even when the inductor 60 and the inductor 41 cannot electromagnetically couple with each other, or when the inductor 60 and the inductor 41 can electromagnetically couple with each other, but the coupling coefficient thereof cannot be sufficiently obtained, by at least electromagnetically coupling the inductor 60 and the inductor 42 to each other, the coupling can be obtained to such an extent that a coupling circuit is formed.

Figure 3:
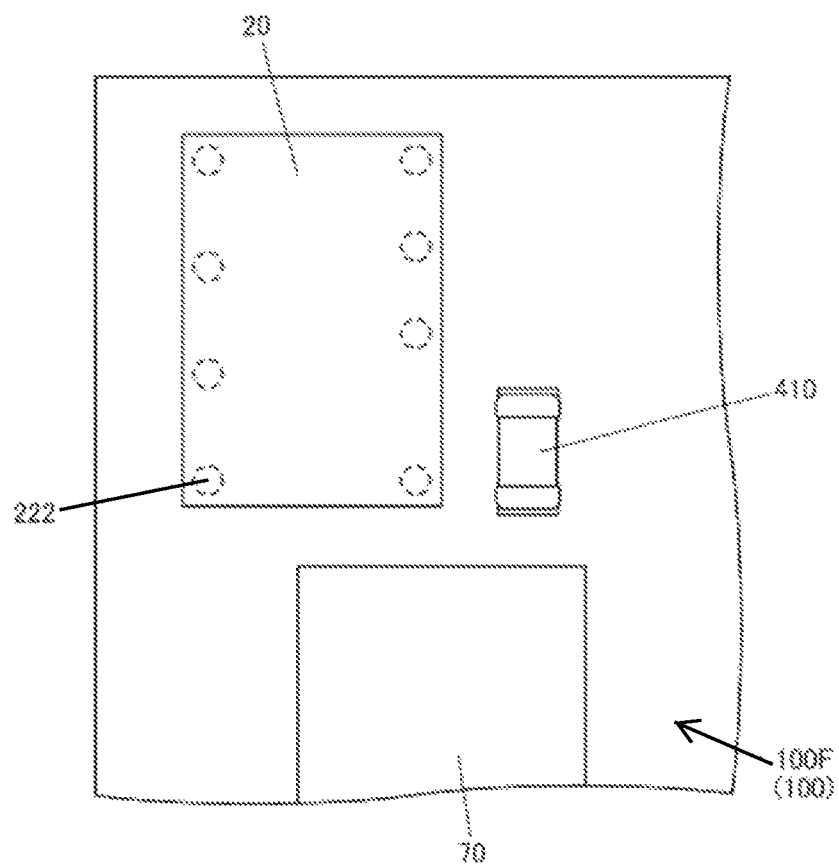
FIG. 3 is a plan view of the high-frequency module according to the embodiment viewed in plan view.

FIG. 3 is a plan view of the high-frequency module 10 illustrated in FIG. 2 when viewed from a side of the first main surface 100F of the laminated substrate 100. As illustrated in the figure, another circuit element 70 may be disposed around the filter 20. In this case, when the circuit element 70 is in a vicinity of the inductor 60, it becomes difficult to reduce a distance between the mounting circuit element 410 and the inductor 60. In such a case, the inductor 60 and the inductor 41 become unlikely to be electromagnetically coupled with each other, and there is a possibility that the coupling circuit cannot be formed between the matching circuit 40 and the inductor 60.

Thus, by coupling the inductor 42 and the inductor 60 to each other, the coupling coefficient can be increased to such an extent that the coupling circuit is formed between the matching circuit 40 and the inductor 60. Since the inductor 42 is formed at the inner and outer layers of the laminated substrate 100 as in the case of the inductor 60, a distance to the inductor 60 is easily reduced, compared to the mounting circuit element 410 (inductor 41) mounted on the laminated substrate 100. Thus, when the inductor 42 is used for the electromagnetic field coupling with the inductor 60, it becomes easy to increase the coupling coefficient between the matching circuit 40 and the inductor 60.

That is, by using the inductor 42 for the electromagnetic field coupling between the matching circuit 40 and the inductor 60 to supplement the insufficient coupling coefficient, it becomes easy to reliably form the sub propagation path between the matching circuit 40 and the inductor 60.

As described above, according to the high-frequency module 10 having the above features, it becomes easy to obtain a coupling circuit between the matching circuit 40 and the inductor 60, in a state where the deterioration in the insertion loss is less likely to occur.

Note that, at this time, along with the inductor 42, the inductor 41 configured of the mounting circuit element 410 may be electromagnetically coupled with the inductor 60. Even in this case, there is no change in a situation where the inductor 41 is used to realize the required element value, or the inductor 42 can be used to supplement the coupling coefficient between the matching circuit 40 and the inductor 60. In other words, the present disclosure is characterized not in that only the layer circuit unit in the matching circuit 40 is electromagnetically coupled, but in that at least the layer circuit unit is electromagnetically coupled.

Further, at least the respective parts of the inductor 42 and the inductor 60 may be provided on the first main surface 100F or the second main surface 100S that is the outer layer of the laminated substrate 100. Even in this case, the effect of the present disclosure is not impaired as described above.

Further, it is sufficient that the mounting circuit element 410 is an element that can be mounted on the laminated substrate 100, and the surface-mount type circuit element as illustrated in the figure, an insertion-mount type circuit element using a lead wire, or the like, may be used. By using any of the above circuit elements, the effect that a required element value can be easily realized with a comparatively small insertion loss can be realized.

Hereinafter, other features of the present embodiment will be described.

(2. Structure of Other Components)

In the high-frequency module 10, a distance between the inductor 42 and the inductor 60 is shorter than a distance between the inductor 41 and the inductor 60. Thus, a coupling coefficient between the inductor 42 and the inductor 60 is higher than a coupling coefficient between the inductor 41 and the inductor 60. A shortest distance between a conductor pattern configuring the inductor 41 and a conductor pattern configuring the inductor 60 can be defined as the distance between the inductor 41 and the inductor 60.

According to the structure as described above, the number of high-frequency signals propagating through a path connecting the inductor 42 and the inductor 60 increases, compared to that of high-frequency signals propagating through a path connecting the inductor 41 and the inductor 60. That is, a coupling circuit between the matching circuit 40 and the inductor 60 becomes more likely to be formed between the inductor 42 and the inductor 60, than between the inductor 41 and the inductor 60.

In this case, even when the coupling coefficient between the inductor 41 and the inductor 60 becomes weak, a coupling circuit is likely to be maintained by the inductor 42 and the inductor 60. That is, even when a distance between the mounting type circuit element 410 and the inductor 60 becomes large, the sub propagation path is unlikely to disappear. Thus, a coupling circuit between the matching circuit 40 and the inductor 60 becomes likely to be formed easily, without being restricted by the arrangement of the mounting circuit element 410.

In addition, at least the respective parts of the inductor 42 and the inductor 60 overlap with each other when viewed in plan view.

Figure 4A:
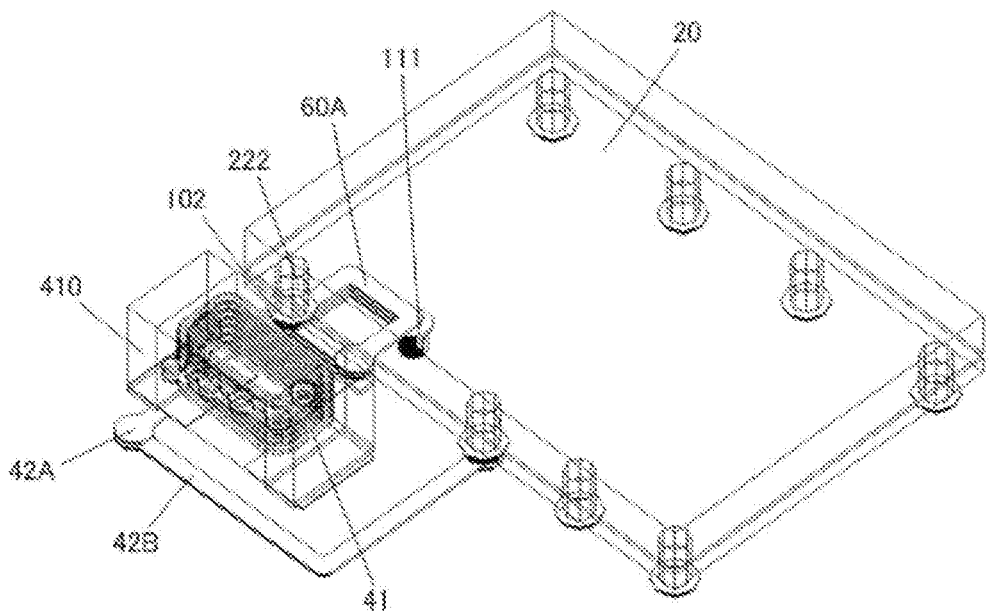
FIGS. 4A and 4B include perspective views in each of which a main portion of the high-frequency module according to the embodiment is obliquely viewed.
Figure 4B:
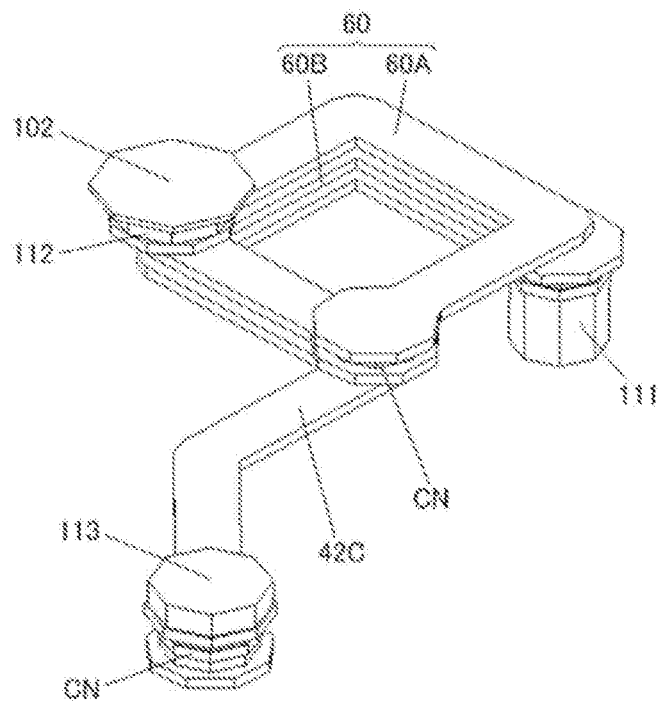

FIGS. 4A and 4B are perspective views in which a main portion of the high-frequency module 10 illustrated in FIG. 2 is obliquely viewed from the side of the first main surface 100F of the laminated substrate 100. FIG. 4A is a diagram illustrating the filter 20, the mounting circuit element 410, the inductors 42 and 60, and the like, and FIG. 4B is a diagram obtained by extracting the inductors 42 and 60, and surroundings thereof from FIG. 4A.

As illustrated in the figure, a part of the linear conductor 42C configuring the inductor 42 overlaps with the respective parts of the linear conductors 60A and 60B configuring the inductor 60.

With the structure described above, compared to when the inductor 42 and the inductor 60 do not overlap with each other, the coupling of a magnetic flux generated in the inductor 42 and a magnetic flux generated in the inductor 60 is likely to be dense. This is because a part of the linear conductor of the inductor 42 in which the magnetic flux is generated overlaps with a part of the linear conductor of the inductor 60 in which the magnetic flux is generated, in plan view.

In this case, the magnetic fluxes generated in both the respective linear conductors are more likely to be tightly coupled to each other, and a coupling coefficient is likely to increase. That is, even when the respective inductor values of the inductors 42 and 60 are comparatively low, it becomes easy to obtain sufficient coupling for forming the sub propagation path, so that the inductor 42 and the inductor 60 can be efficiently coupled to each other. Thus, the coupling between the matching circuit 40 and the inductor 60 can be realized more efficiently.

Note that, in this case, at least a part of the linear conductors 42A, 42B, and 42C configuring the inductor 42 is formed in a layer separate from a layer in which the linear conductors 60A and 60B configuring the inductor 60 are formed, in a plurality of insulator layers including the inner layer and the outer layer of the laminated substrate 100.

As illustrated in FIG. 4B, each of the inductor 42 and the inductor 60 to be electromagnetically coupled to each other is preferably a spiral-shaped linear conductor configuring of a linear conductor and an interlayer connection conductor, not being a straight linear conductor. Since the inductors 42 and 60 are formed at the inner and outer layers of the laminated substrate 100, a space in which the inductors 42 and 60 are formed is limited. When inductors are to be formed in such a limited space, a conductor can be configured more easily and densely by using a spiral-shaped linear conductor, rather than by using a straight linear conductor, and thus a stronger magnetic flux can be generated. Accordingly, the coupling between inductor 42 and inductor 60 can be made to be more robust.

Additionally, as illustrated in FIG. 2, the inductor 42 and the inductor 60 are connected to the ground pattern GND in the inner layer of the laminated substrate 100 by the common via conductor 111.

According to the above structure, the number of components to be used can be reduced, compared to a case where the inductors 42 and 60 are connected to the ground pattern GND by the respective separate via conductors. Thus, the structure of the present disclosure can be realized with a smaller space, so that reduction of the high-frequency module 10 in size can be expected.

The high-frequency module 10 having the circuit configuration and structure described above can also be applied to a circuit configuration including a plurality of filters such as duplexers.

Figure 5:
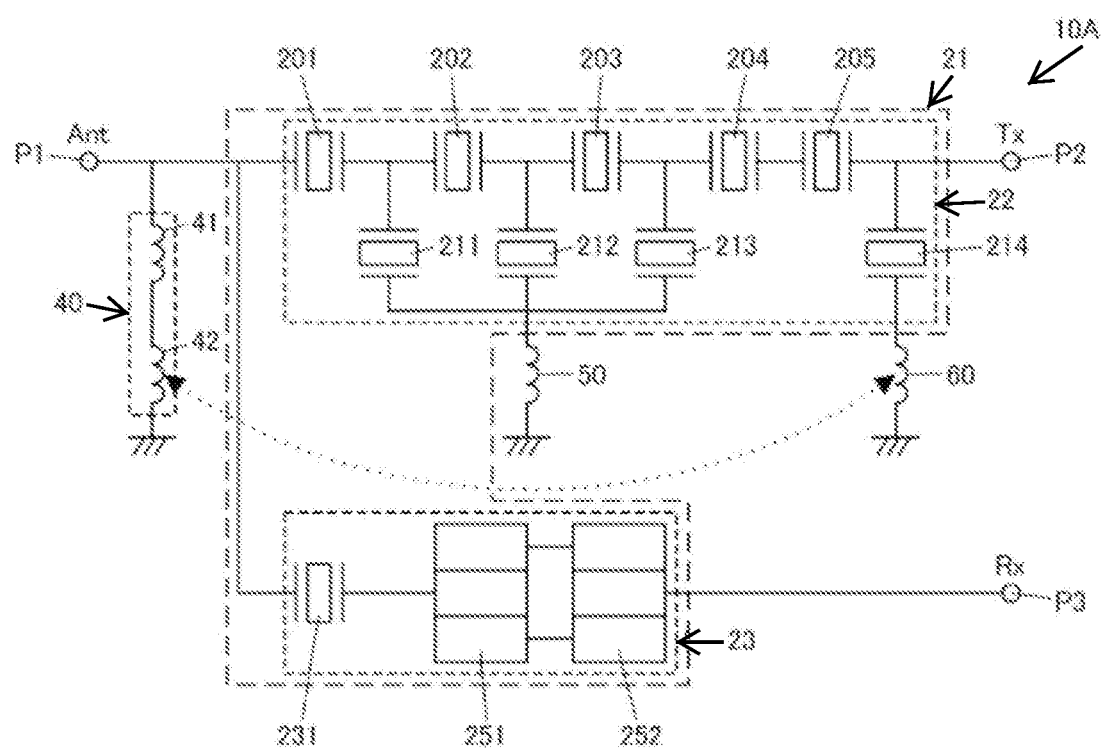
FIG. 5 is a circuit diagram illustrating a circuit design in a case where the high-frequency module according to the embodiment is applied to a duplexer configuration.

FIG. 5 is a circuit diagram illustrating a circuit design of a high-frequency module 10A having a duplexer configuration. The high-frequency module 10A illustrated in the figure further includes a terminal P3, as compared to the high-frequency module 10. Further, a difference from the high-frequency module 10 is that a filter 21 connected between the terminal P1 and the terminal P2 includes two filter units.

In the high-frequency module 10A, the filter 21 is configured to include a transmission filter unit 22 and a reception filter unit 23.

The transmission filter unit 22 is a filter unit that filters a transmission signal generated by a transmission circuit in a transmission pass band. At this time, the transmission signal is inputted to the transmission filter unit 22 via the terminal P2 that is a transmission side terminal, and is outputted to the terminal P1. Note that, a circuit configuration of the transmission filter unit 22 is the same as that of the filter 20 in the high-frequency module 10.

The reception filter unit 23 is a filter unit that filters a reception signal received from an antenna element (not illustrated) or the like in a reception pass band. The reception pass band is a frequency band different from the transmission pass band, and is set so as to fall within an attenuation band range outside the transmission pass band. At this time, the reception signal is inputted from the terminal P1 to the reception filter unit 23, and is outputted to the terminal P3 that is a reception side terminal.

The reception filter unit 23 is connected between the terminal P1 and the terminal P3. The reception filter unit 23 includes a series arm resonator 231 and longitudinally-coupled resonators 251 and 252. The series arm resonator 231 and the longitudinally-coupled resonators 251 and 252 are each provided on a path connecting the terminal P1 and the terminal P3, and are connected in series to each other.

As with the high-frequency module 10, the matching circuit 40 and the inductor 60 are electromagnetically coupled to each other in the high-frequency module 10A, to form a sub propagation path that propagates a high-frequency signal. Thus, a coupling coefficient between the matching circuit 40 and the inductor 60 can be adjusted to improve the attenuation characteristics of the filter unit.

In particular, by adjusting amplitude and a phase of a high-frequency signal propagating through the sub propagation path to the amplitude and phase that are canceled out when combined with a high-frequency signal in the reception pass band, the isolation between the terminal P2 and the terminal P3 is enhanced. Thus, by applying the high-frequency module according to the present disclosure to a duplexer configuration, a high-frequency module in which the isolation characteristics between the filter units are excellent can be obtained.

Note that, the high-frequency module according to the present disclosure is applicable not only to the duplexer configuration but also to a high-frequency module having a multiplexer configuration including three or more filters. In this case as well, by forming a sub propagation path with the electromagnetic field coupling as described above, a high-frequency module having excellent isolation characteristics can be obtained.

10, 10A HIGH-FREQUENCY MODULE
20, 21 FILTER
22, 23 FILTER UNIT
40 MATCHING CIRCUIT
41, 42, 50, 60 INDUCTOR
42A, 42B, 42C, 60A, 60B LINEAR CONDUCTOR
100 LAMINATED SUBSTRATE
100F FIRST MAIN SURFACE
100S SECOND MAIN SURFACE
102, 103 ELECTRODE PAD
111, 112, 113 VIA CONDUCTOR
201, 202, 203, 204, 205, 231 SERIES ARM RESONATOR
211, 212, 213, 214 PARALLEL ARM RESONATOR
222 BUMP
251, 252 LONGITUDINALLY-COUPLED RESONATOR
410 MOUNTING CIRCUIT ELEMENT
CN INTERLAYER CONNECTION CONDUCTOR
GND GROUND PATTERN
P1, P2, P3 TERMINAL

What is claimed is:

1. A high-frequency module, comprising:
a laminated substrate formed by laminating a plurality of insulator layers;
a first terminal and a second terminal provided on the laminated substrate;
a filter connected between the first terminal and the second terminal;
a matching circuit connected between the first terminal and the filter; and
a first inductor provided as a conductor pattern in or on the laminated substrate, and connected between the filter and a ground, wherein
the matching circuit includes
a mounting circuit provided as an individual component on the laminated substrate, and
a layer circuit provided as a conductor pattern in or on the laminated substrate, and
the layer circuit is electromagnetically coupled to the first inductor, and
the mounting circuit and the layer circuit each include an inductor connected in series with each other in a shunt circuit of the matching circuit.

2. The high-frequency module according to claim 1, wherein
a distance between the layer circuit and the first inductor is shorter than a distance between the mounting circuit and the first inductor.

3. The high-frequency module according to claim 2, wherein
a coupling coefficient between the layer circuit and the first inductor is higher than a coupling coefficient between the mounting circuit and the first inductor.

4. The high-frequency module according to claim 2, further comprising
at least one second inductor different from the first inductor and connected between the filter and the ground, wherein
the first terminal is an output terminal from which a high-frequency signal is outputted,
the second terminal is an input terminal to which a high-frequency signal is inputted, and
the first inductor is an inductor closest to the second terminal, among a plurality of inductors including the first inductor and the at least one second inductor.

5. The high-frequency module according to claim 2, wherein
at least a part of the layer circuit is provided in or on a layer separate from a layer in or on which the first inductor is provided among the plurality of insulator layers of the laminated substrate, and
the at least the part of the layer circuit and the first inductor overlap with each other when viewed in plan view.

6. The high-frequency module according to claim 2, wherein
the layer circuit and the first inductor are connected to the ground by a common via conductor.

7. The high-frequency module according to claim 2, further comprising
a third terminal, wherein
the filter includes
a first filter connected between the first terminal and the second terminal, and
a second filter connected between the first terminal and the third terminal.

8. The high-frequency module according to claim 1, wherein
a coupling coefficient between the layer circuit and the first inductor is higher than a coupling coefficient between the mounting circuit and the first inductor.

9. The high-frequency module according to claim 8, further comprising
at least one second inductor different from the first inductor and connected between the filter and the ground, wherein
the first terminal is an output terminal from which a high-frequency signal is outputted,
the second terminal is an input terminal to which a high-frequency signal is inputted, and
the first inductor is an inductor closest to the second terminal, among a plurality of inductors including the first inductor and the at least one second inductor.

10. The high-frequency module according to claim 8, wherein
at least a part of the layer circuit is provided in or on a layer separate from a layer in or on which the first inductor is provided among the plurality of insulator layers of the laminated substrate, and the at least the part of the layer circuit and the first inductor overlap with each other when viewed in plan view.

11. The high-frequency module according to claim 8, wherein the layer circuit and the first inductor are connected to the ground by a common via conductor.

12. The high-frequency module according to claim 8, further comprising a third terminal, wherein the filter includes a first filter connected between the first terminal and the second terminal, and a second filter connected between the first terminal and the third terminal.

13. The high-frequency module according to claim 1, further comprising at least one second inductor different from the first inductor and connected between the filter and the ground, wherein the first terminal is an output terminal from which a high-frequency signal is outputted, the second terminal is an input terminal to which a high-frequency signal is inputted, and the first inductor is an inductor closest to the second terminal, among a plurality of inductors including the first inductor and the at least one second inductor.

14. The high-frequency module according to claim 13, wherein at least a part of the layer circuit is provided in or on a layer separate from a layer in or on which the first inductor is provided among the plurality of insulator layers of the laminated substrate, and the at least the part of the layer circuit and the first inductor overlap with each other when viewed in plan view.

15. The high-frequency module according to claim 13, wherein the layer circuit and the first inductor are connected to the ground by a common via conductor.

16. The high-frequency module according to claim 1, wherein the filter is a transmission filter filtering a transmission signal.

17. The high-frequency module according to claim 16, wherein at least a part of the layer circuit is provided in or on a layer separate from a layer in or on which the first inductor is provided among the plurality of insulator layers of the laminated substrate, and the at least the part of the layer circuit and the first inductor overlap with each other when viewed in plan view.

18. The high-frequency module according to claim 1, wherein at least a part of the layer circuit is provided in or on a layer separate from a layer in or on which the first inductor is provided among the plurality of insulator layers of the laminated substrate, and the at least the part of the layer circuit and the first inductor overlap with each other when viewed in plan view.

19. The high-frequency module according to claim 1, wherein the layer circuit and the first inductor are connected to the ground by a common via conductor.

20. The high-frequency module according to claim 1, further comprising a third terminal, wherein the filter includes a first filter connected between the first terminal and the second terminal, and a second filter connected between the first terminal and the third terminal.

21. The high-frequency module according to claim 1, wherein only one end of the matching circuit is provided on a path connecting a node between at least one of the terminals and the filter, and another end of the matching circuit is not provided on the path.

\* \* \* \* \*